United States Patent [19]

Twachtmann et al.

[11] Patent Number: 5,208,735
[45] Date of Patent: May 4, 1993

[54] LATCHING SYSTEM FOR AVIONICS LINE REPLACEABLE MODULES INCLUDING A HANDLE CAM AND A PIVOTING LATCH CAM

[75] Inventors: Todd Twachtmann, Marion; James B. Shumaker, Cedar Rapids; M. Duane Weltha, Marion; Chris L. Thompson; David M. Mick, both of Cedar Rapids, all of Iowa

[73] Assignee: Rockwell International Corporation, Seal Beach, Calif.

[21] Appl. No.: 805,665

[22] Filed: Dec. 12, 1991

[51] Int. Cl.$^5$ .................... H05K 7/14; A47B 95/02
[52] U.S. Cl. .................... 361/391; 361/429; 292/35; 403/18; 403/322; 312/332.1
[58] Field of Search .................... 211/26; 292/34, 35, 292/46, 52, 53, 210; 403/18, 322; 361/339, 344, 391, 415, 429; 439/372; 49/277, 278; 312/332.1

[56] References Cited

U.S. PATENT DOCUMENTS

| | | | |
|---|---|---|---|
| 2,672,246 | 3/1954 | Barnett et al. | 312/320 |
| 2,861,859 | 11/1958 | Newcomer, Jr. et al. | 312/320 |
| 3,140,905 | 7/1964 | Trotter et al. | 312/320 |
| 3,199,938 | 8/1965 | Vouk | 292/53 X |
| 3,228,740 | 1/1966 | Lundell | 312/320 |
| 3,313,586 | 4/1967 | McClintock | 312/320 |
| 3,367,732 | 2/1968 | Beye | 312/320 |
| 3,484,127 | 12/1969 | Pastva | 292/210 |
| 3,575,482 | 4/1971 | MacMaster et al. | 312/320 |
| 4,003,614 | 1/1977 | Geer et al. | 312/320 |
| 4,006,951 | 2/1977 | Geer et al. | 312/320 |
| 4,778,401 | 10/1988 | Boudreau et al. | 361/415 X |
| 4,931,907 | 6/1990 | Robinson et al. | 361/391 |

FOREIGN PATENT DOCUMENTS 473160 7/1952 Italy .................... 292/34

Primary Examiner—Leo P. Picard
Assistant Examiner—Michael W. Phillips
Attorney, Agent, or Firm—Gregory G. Williams; M. Lee Murrah; H. Fredrick Hamann

[57] ABSTRACT

A system for mounting avionics line replaceable modules in an avionics rack where electrical connections are made between the back end of the LRM and connectors disposed within the rack and where the latching assembly includes two rotating cams, one at the bottom of the LRM and the other at the top of engaging spring biased latch plates and thereby securely holding the LRM in the rack.

3 Claims, 3 Drawing Sheets

LATCHING SYSTEM FOR AVIONICS LINE REPLACEABLE MODULES INCLUDING A HANDLE CAM AND A PIVOTING LATCH CAM

FIELD OF THE INVENTION

The present invention relates to aviation electronics, and more particularly relates to avionics systems having several separate line replaceable modules (LRMs) as components to the system; and even more particularly relates to an apparatus for interconnecting and securing an LRM to an avionics system hardware rack.

BACKGROUND OF THE INVENTION

In the past, avionics engineers have frequently been called upon to mount numerous components or LRM's, in a single rack of an avionics system. Typically these holddowns did not hold the LRM's sufficiently secure to prevent relative notion between the mated connectors located in the rear of the LRM and in the mating cabinet. As demands for improved connector electrical performance increased, this relative motion, and the related degradation in electrical performance, became an increasingly important problem. There have been several previous unsuccessful attempts to overcome these problems. One of the methods of mounting LRM's in a single rack that was proposed in the past, is to use a single long screw bolt disposed through the center of the LRM. Another approach was to use a single screw bolt at the bottom of the LRM. Yet another approach for avionics mounting systems was to include two drive screw bolts through the LRM, one at the top and the other at the bottom, with a chain drive mechanism connecting the two screw bolts.

While these approaches have enjoyed some appeal in the past, they do have several serious drawbacks. First of all, the approach of using a screw through the center of the LRM takes up valuable space inside the LRM and requires the designers of the LRM to literally design the internal parts of the LRM around the center bolt. Furthermore this design has limited ability in providing front-end support of the LRM. The second approach of using a single screw bolt at the bottom of the LRM has a disadvantage in that it does not provide for maintaining sufficient force at the side of the LRM opposite from the only screw bolt. The approach which used two drive screws and a chain-drive mechanism with a slip clutch has disadvantages in the complex nature of the interworkings between the sprockets, chain and slip clutch.

Consequently, there exists a need for improvement in systems for mounting LRM's in avionics systems.

SUMMARY OF THE INVENTION

It is an object of the present invention to provide a mounting apparatus for an avionics system which is easy to use.

It is a feature of the present invention to include a carrying handle/latch apparatus for use as a carrying handle before installation and as a latch during and after installation.

It is an advantage of the present invention to eliminate the need for long bolts extending through the LRM.

It is another object of the present invention to provide the LRM with a precise yet selectable dual directional fitting force with the rack of the avionics system.

It is another feature of the present invention to use a first and a second spring loaded latch which contain springs which are chosen from a selection of springs having predetermined and different characteristics.

It is another advantage of the present invention to allow the LRM to fit within the rack in such a manner that the pressure placed upon any connections, plugs or jacks at the back of the LRM and between the LRM and the rack are precisely maintained, regardless of the mated "home" position of the connectors. This feature is achieved by the cam geometry which applies predetermined directed forces at the rear of the LRM.

The present invention provides an avionics mounting system which is designed to satisfy the aforementioned needs, produce the earlier propounded objects, include the above described features and achieve the already articulated advantages. The invention is carried out in a "bolt-less" system in a sense that the long bolt found through the center of the LRM is eliminated. Instead, a handle/dual latch assembly is used to provide attachment between the LRM and the rack of the avionics system.

Accordingly, the present invention provides a system for mounting avionics LRMs into racks of avionics systems, including a first latch cam, a second latch cam, a carrying handle and a sliding arm disposed between the carrying handle and the second latch cam, the first and second latch cam cooperate with first and second spring loaded latch plates respectfully with said first and second spring loaded latch plates having springs therein with predetermined characteristics.

BRIEF DESCRIPTION OF THE DRAWINGS

The invention may be more fully understood by reading the following description of a preferred embodiment of the invention in conjunction with appended drawings wherein.

DETAILED DESCRIPTION OF THE INVENTION

Figure 1:
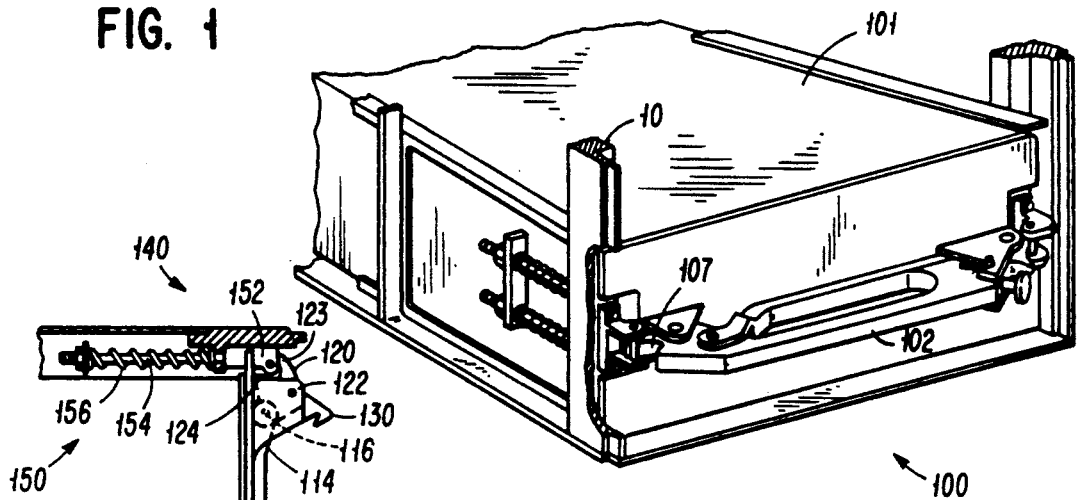
FIG. 1 is a perspective view of the LRM, latch assembly and rack, all of the present invention.

Now referring to FIG. 1, there is shown a perspective view of the LRM, latch assembly, and rack of the present invention. There is shown an LRM 101, a rack 10 and a latch assembly 100 having a handle 102 and a first cam latch and a second cam. Latch assembly 100 is shown in more detail in FIGS. 2A, 2B, 2C and 3. FIG. 1 shows the LRM having a latch assembly end 11 which is at an opposite end of the LRM from the rack connection end (not shown). Rack 10 and LRM 101 are designed so that any connections between the rack 10 and the rack connection end of LRM 101 are held firmly in place by the latch assembly 100.

Figure 2A:
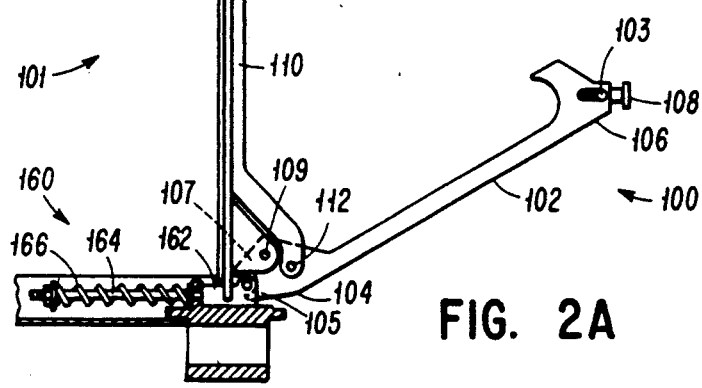
FIGS. 2A, 2B and 2C are side views of the latch assembly of the present invention in various positions.
Figure 2B:
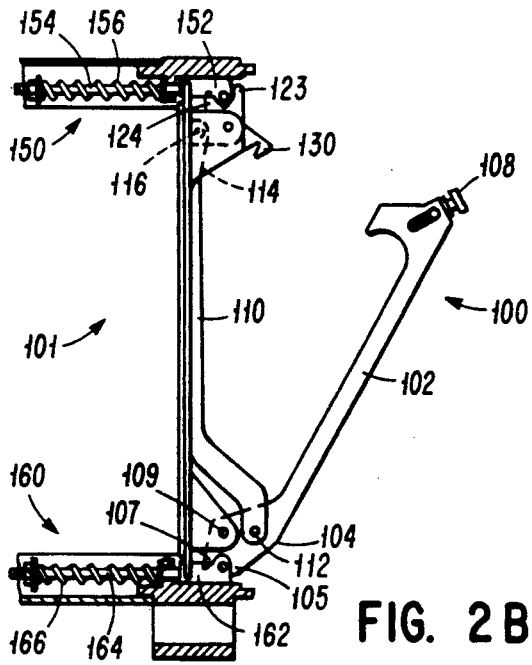
Figure 2C:
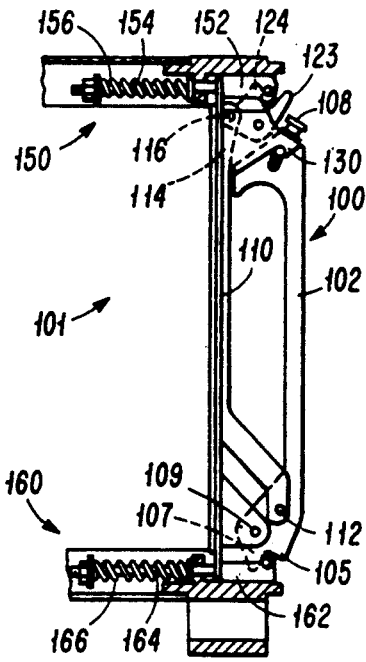
Figure 3:
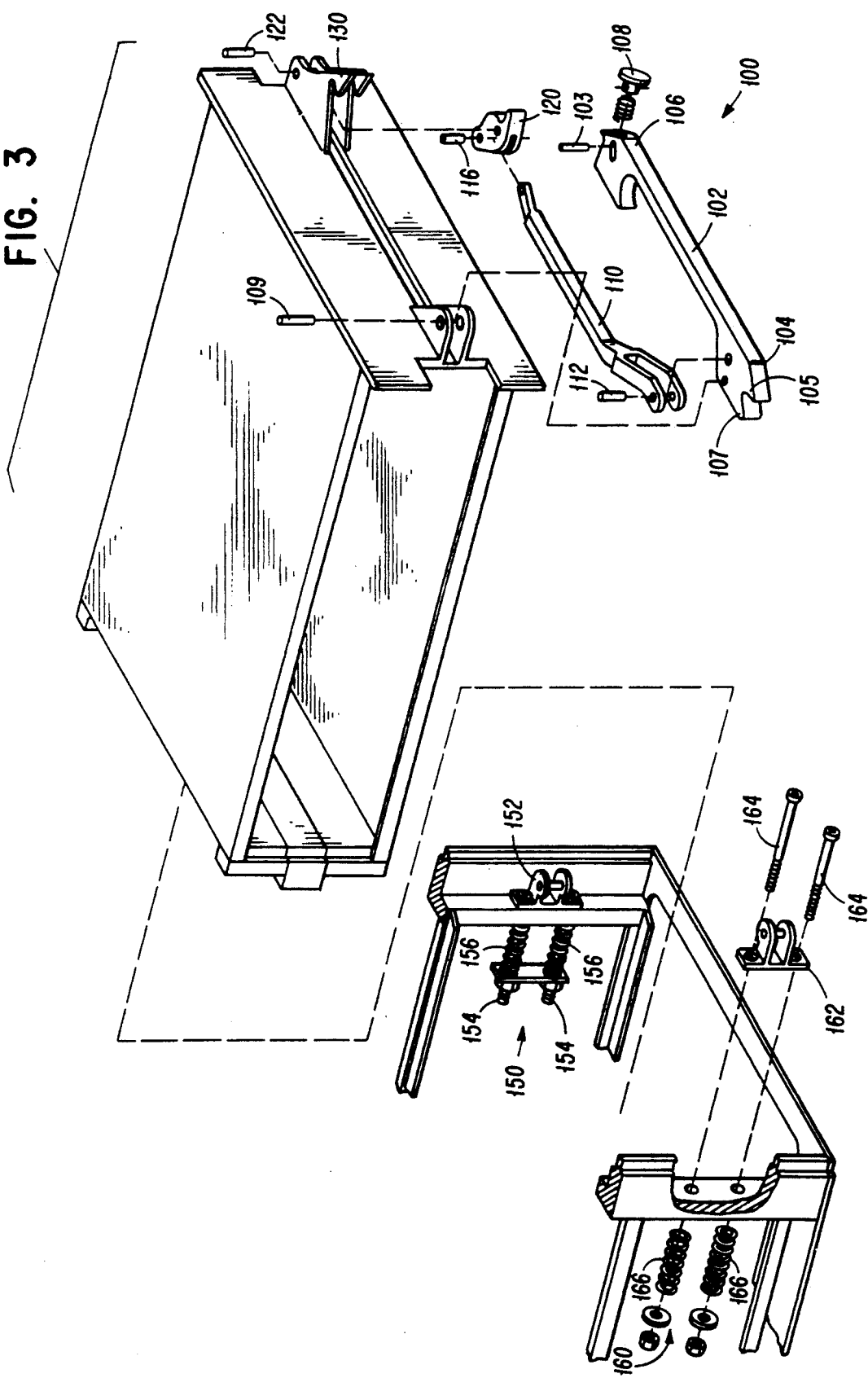
FIG. 3 is an exploded view of the latch assembly of the present invention.

Now referring to FIGS. 2A, 2B and 2C and more particularly to FIG. 2A there is shown a hold-down system, of the present invention, generally designated 100, which includes a carrying handle 102 having a pivoting cam end 104 and a mating end 106 which has disposed therein a spring-loaded latch release button 108 and spring loaded latch pin 103. Carrying handle 102 is coupled with the LRM 101 at a pivot point 109, carrying handle 102 further having a first handle cam tooth 105 and a second handle cam tooth 107. Coupled with carrying handle 102 at connecting point 112 is sliding arm 110 which has a latch end 114 with a latch pivot point 116 therein. Sliding arm 110 is coupled with latch cam 120 at latch pivot point 116. Latch cam 120 is coupled at LRM latch pivoting point 122 to the LRM 101. Latch cam 120 has a first latch cam tooth 123 and a second latch cam tooth 124. Disposed on LRM 101 is spring-loaded latch receiving hook 130. Also shown is the avionics rack 140 having a first spring-loaded latch plate 150 and a second spring-loaded latch plate 160. Latch plates 150 and 160 are showing having a latch plate head 152 and 162, respectively, which are coupled with pistons 154 and 164, respectively, which are disposed through latch plate springs 156 and 166 respectively.

Now referring to FIG. 2B, there is shown the latch assembly and rack combination of FIGS. 2A and 2C where the carrying handle 102 is in a position between fully opened and closed.

Now referring to FIG. 2C, there is shown the latch assembly and rack combination of FIGS. 2A and 2B where carrying handle 102 is shown in the closed position with catch cam tooth 124 and handle cam tooth 107 applying pressure upward on latch plate heads 152 and 162 respectively.

In operation and now referring to FIGS. 2A, 2B and 2C, the LRM 101 is inserted in to the rack 10 so that the connections at the rack connector end of LRM 101 are in connection with the connections on the rack 10 and further so that cam teeth 123 and 105 are disposed on top of spring-latch plate heads 152 and 162 respectively. As the handle 102 is depressed thereby decreasing the angle between slide arm 110 and carrying handle 102 the cam tooth 107 is caused to rotate around pivot point 109 and come in contact with spring-latch plate head 162. Sliding arm 110 is caused to slide across the LRM 101 and thereby causing latch cam 120 to rotate around latch pivot point 122 so that latch cam tooth 124 engages spring-latch plate head 152 and urges head 152 in a direction resisted by spring 156. As latch handle 102 is completely depressed and spring loaded latch release button 108 is coupled with latch hook 130 the sliding arm 110 has rotated cam 120 so that cam tooth 124 is now lifting latch plate head 152 further. Similarly, as carrying handle 102 is closed cam tooth 107 causes spring-latch plate head 162 to be lifted.

Figure 4:
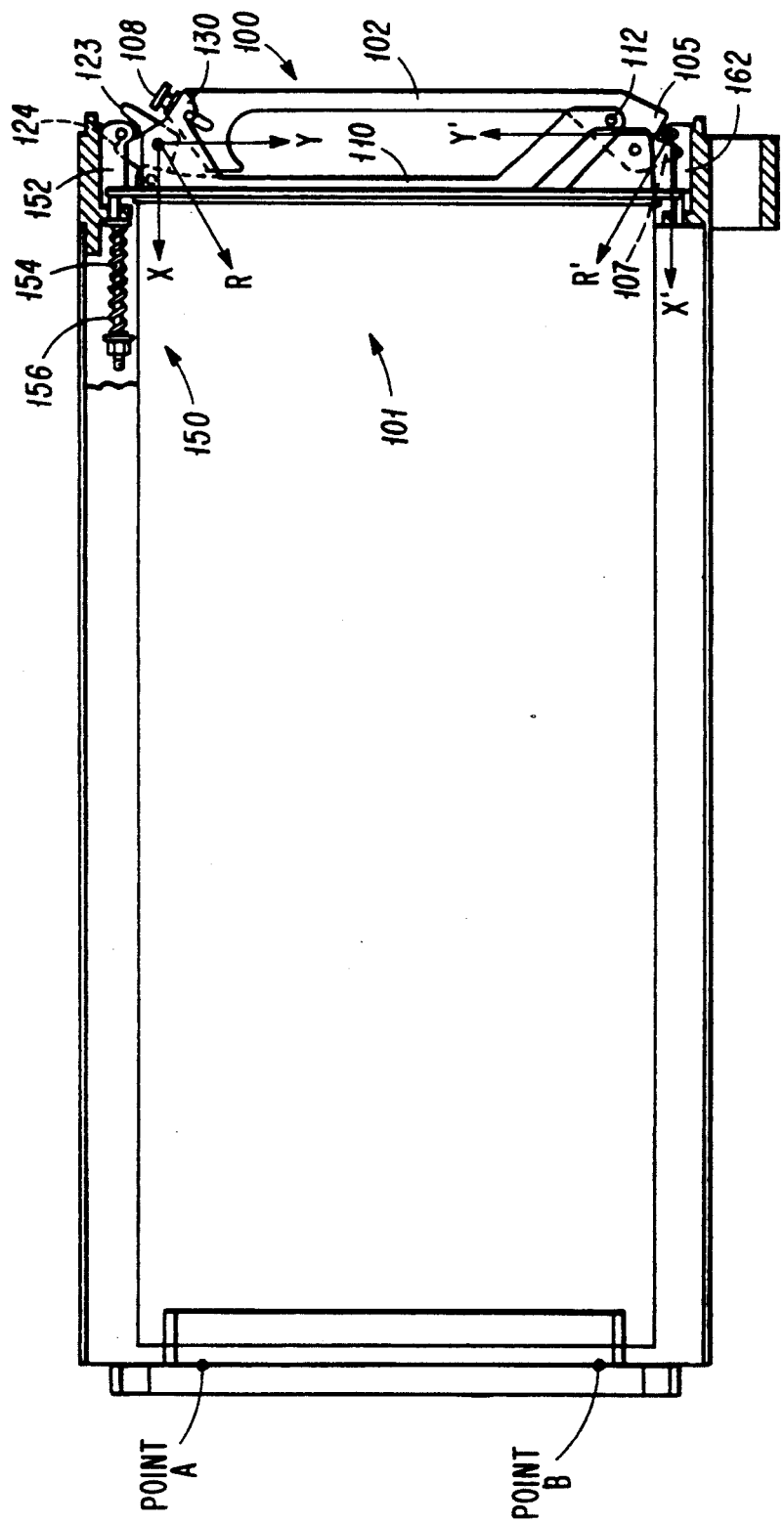
FIG. 4 is cross sectional view of the LRM, latch assembly and rack of the present invention which graphically shows force vectors from the cams.

It is important to note that the present invention achieves some of its material advantages by utilizing the two cams so that as one of the cams is completely engaged the other cam has freedom of movement to also fully engage the LRM. FIG. 4 demonstrates this feature. For example, assume that as the LRM is inserted rearward, solid connector engagement is first achieved at point A. This solid connector engagement prevents any further LRM engagement travel at point A. However, the necessary solid connector engagement has not yet been achieved at point B due to variation in connector alignment. To achieve solid engagement at point B, the cam profile allows the force vector "R", aimed at point B, to rotate the LRM in a clockwise direction until solid engagement is in fact achieved at point B. The force vector X maintains solid engagement at point A. This is the "home" position for the LRM and the connectors. The LRM can not move from this "home" position without exceding the predetermined latch spring preload. This essentially locks the LRM in the "home" position and prevents relative motion between the mated connectors.

Similarly, the force vector R' would rotate the LRM in the counter clockwise direction in the event that solid connector engagement was first achieved at point B.

While particular embodiments of the present invention have been shown and described, it should be clear that changes and modifications may be made to such embodiments without departing from the true scope and spirit of the invention. It is intended that the appended claims cover all such changes and modifications.

We claim:

1. An improved mounting system for avionics equipment comprising:
   a rack,
   a carrying handle,
   a pivoting handle cam disposed on a first end of said carrying handle,
   a pivoting latch cam;
   a slide arm coupled with said pivoting latch cam and said carrying handle;
   a first spring loaded latch plate disposed on said rack for coupling with said pivoting handle cam; and,
   a second spring loaded latch plate disposed on said rack for coupling with said pivoting latch cam.

2. An apparatus for securing aviation electronics modules in an aircraft, comprising:
   a rack having a front end and a back end and a plurality of voids therein, said rack being mountable inside an aircraft;
   an aviation electronics module having a front end and a back end, disposed within one of said plurality of voids within said rack;
   a first cam disposed on the module for providing a predetermined force on the module with respect to the rack;
   a second cam disposed on the module for providing a predetermined force on the module with respect to the rack;
   a first lever means coupled with and manipulating the first cam, so a predetermined force is applied to the module when the lever means is manipulated; and,
   a second lever means coupled with said first lever means and said second cam so a manipulation of said first lever means results in a predetermined force being applied to the module by the second cam.

3. An avionics holddown system, comprising:
   a rack, for receiving modules, mountable in an aircraft, said rack having a latch end and a connector end;
   a module having a latch end and a connector end, said module disposed in said rack so that said latch end of said module is aligned with said latch end of said rack and said connector end of said module is aligned with said connector end of said rack;
   said first cam disposed on said first lever means and said second cam coupled to said first lever means;
   a first cam disposed on said latch end of said module for engaging said latch end of said rack;
   a second cam disposed on said latch end of said module for engaging said latch end of said rack;
   a first spring-loaded latch plate disposed on said latch end of said rack for receiving said first cam;

a second spring-loaded latch plate disposed on said latch end of said rack for receiving said second cam;

a latch hook disposed on said latch end of said module;

a spring-loaded latch pin disposed on said first lever means for cooperating with said latch hook and thereby maintaining said first lever means in a closed position when said spring-loaded latch pin engages said latch hook; and, said first spring loaded latch plate and said second spring-loaded latch plate having springs therein with predetermined characteristics, so that a manipulation of the first lever means results in engagement of one of said cams with one of said latch plates and providing a predetermined force thereon, while permitting further manipulation of said first lever means to result in engagement of another of said cams with another of said latch-plates so that a predetermined force is applied.

* * * * *